(12) United States Patent
Benjavasukul et al.

(10) Patent No.: US 8,431,443 B2
(45) Date of Patent: Apr. 30, 2013

(54) METALLIC SOLDERABILITY PRESERVATION COATING ON METAL PART OF SEMICONDUCTOR PACKAGE TO PREVENT OXIDE

(75) Inventors: Woraya Benjavasukul, Bangkok (TH); Thipyaporn Somrubpornpinan, Samuthprakam (TH); Panikan Charapaka, Phatumthanee (TH)

(73) Assignee: Utac Thai Limited, Bangna, Bangkok (TH)

( * ) Notice: Subject to any disclaimer, the term of this patent is extended or adjusted under 35 U.S.C. 154(b) by 17 days.

(21) Appl. No.: 13/156,257

(22) Filed: Jun. 8, 2011

(65) Prior Publication Data

US 2011/0232693 A1 Sep. 29, 2011

Related U.S. Application Data

(62) Division of application No. 12/579,574, filed on Oct. 15, 2009.

(60) Provisional application No. 61/210,125, filed on Mar. 12, 2009.

(51) Int. Cl.
*H01L 21/00* (2006.01)
*H01L 21/306* (2006.01)

(52) U.S. Cl.
USPC .................. 438/115; 438/124; 257/E21.224

(58) Field of Classification Search .......... 438/113–115, 438/458, 460–465; 257/E21.224, E21.228; 510/175
See application file for complete search history.

(56) References Cited

U.S. PATENT DOCUMENTS

| | | | |
|---|---|---|---|
| 3,611,061 A | 10/1971 | Segerson | 317/234 R |
| 4,411,719 A | 10/1983 | Lindberg | 156/64 |
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,247,248 A | 9/1993 | Fukunaga | 324/158 |
| 5,248,075 A | 9/1993 | Young et al. | 228/5.1 |
| 5,396,185 A | 3/1995 | Honma et al. | 324/754 |
| 5,397,921 A | 3/1995 | Karnezos | 257/779 |
| 5,455,455 A | 10/1995 | Badehi | |
| 5,479,105 A | 12/1995 | Kim et al. | 324/755 |
| 5,535,101 A | 7/1996 | Miles et al. | 361/808 |
| 5,596,231 A | 1/1997 | Combs | 257/776 |

(Continued)

OTHER PUBLICATIONS

Michael Quirk and Julian Serda, *Semiconductor Manufacturing Technology*, Pearson Education International, Pearson Prentice Hall, 2001, p. 587-588.

(Continued)

*Primary Examiner* — Charles Garber
*Assistant Examiner* — Calvin Choi
(74) *Attorney, Agent, or Firm* — Haverstock & Owens LLP

(57) ABSTRACT

Embodiments of the present invention are directed to metallic solderability preservation coating on connectors of semiconductor package to prevent oxide. Singulated semiconductor packages can have contaminants, such as oxides, on exposed metal areas of the connectors. Oxidation typically occurs on the exposed metal areas when the semiconductor packages are not stored in appropriate environments. Copper oxides prevent the connectors from soldering well. An anti-tarnish solution of the present invention is used to coat the connectors during sawing, after sawing, or both of a semiconductor array to preserve metallic solderability. The anti-tarnish solution is a metallic solution, which advantageously allows the semiconductor packages to not need be assembled immediately after fabrication.

11 Claims, 8 Drawing Sheets

U.S. PATENT DOCUMENTS

| | | | | |
|---|---|---|---|---|
| 5,843,808 A | 12/1998 | Karnezos | | 438/121 |
| 5,866,949 A | 2/1999 | Schueller | | |
| 5,990,692 A | 11/1999 | Jeong et al. | | 324/755 |
| 6,072,239 A | 6/2000 | Yoneda et al. | | 257/730 |
| 6,111,324 A | 8/2000 | Sheppard et al. | | 257/787 |
| 6,136,460 A | 10/2000 | Chen et al. | | |
| 6,159,770 A | 12/2000 | Tetaka et al. | | 438/112 |
| 6,229,200 B1 | 5/2001 | Mclellan et al. | | 257/666 |
| 6,242,281 B1 | 6/2001 | Mclellan et al. | | 438/106 |
| 6,284,569 B1 | 9/2001 | Sheppard et al. | | 438/110 |
| 6,285,075 B1 | 9/2001 | Combs et al. | | 257/675 |
| 6,294,100 B1 | 9/2001 | Fan et al. | | 216/14 |
| 6,304,000 B1 | 10/2001 | Isshiki et al. | | 257/782 |
| 6,326,678 B1 | 12/2001 | Karnezos et al. | | 257/666 |
| 6,329,711 B1 | 12/2001 | Kawahara et al. | | 257/698 |
| 6,353,263 B1 | 3/2002 | Dotta et al. | | 257/777 |
| 6,376,921 B1 | 4/2002 | Yoneda et al. | | 257/787 |
| 6,392,427 B1 | 5/2002 | Yang | | 324/755 |
| 6,400,004 B1 | 6/2002 | Fan et al. | | |
| 6,414,385 B1 | 7/2002 | Huang et al. | | 257/690 |
| 6,429,048 B1 | 8/2002 | McLellan et al. | | 438/108 |
| 6,451,709 B1 | 9/2002 | Hembree | | 438/759 |
| 6,455,348 B1 | 9/2002 | Yamaguchi | | 438/106 |
| 6,489,218 B1 | 12/2002 | Kim et al. | | 438/460 |
| 6,498,099 B1 | 12/2002 | McLellan et al. | | 438/689 |
| 6,506,314 B1 | 1/2003 | Whitney, Jr. et al. | | |
| 6,507,116 B1 | 1/2003 | Caletka et al. | | 257/778 |
| 6,545,332 B2 | 4/2003 | Huang | | 257/433 |
| 6,545,347 B2 | 4/2003 | McClellan | | 257/690 |
| 6,552,417 B2 | 4/2003 | Combs | | 257/666 |
| 6,552,423 B2 | 4/2003 | Song et al. | | 257/679 |
| 6,566,740 B2 | 5/2003 | Yasunaga et al. | | 257/670 |
| 6,573,121 B2 | 6/2003 | Yoneda et al. | | 438/106 |
| 6,585,905 B1 | 7/2003 | Fan et al. | | 216/14 |
| 6,586,834 B1 | 7/2003 | Sze et al. | | 257/712 |
| 6,635,957 B2 | 10/2003 | Kwan et al. | | 257/691 |
| 6,639,308 B1 | 10/2003 | Crowley et al. | | |
| 6,660,626 B1 * | 12/2003 | Lin | | 438/618 |
| 6,667,191 B1 | 12/2003 | McLellan et al. | | 438/121 |
| 6,686,667 B2 | 2/2004 | Chen et al. | | 257/787 |
| 6,703,696 B2 | 3/2004 | Ikenaga et al. | | 257/678 |
| 6,724,071 B2 | 4/2004 | Combs | | 257/666 |
| 6,734,044 B1 | 5/2004 | Lin et al. | | 438/123 |
| 6,734,552 B2 | 5/2004 | Combs et al. | | 257/707 |
| 6,737,755 B1 | 5/2004 | McLellan et al. | | 257/796 |
| 6,764,880 B2 | 7/2004 | Wu et al. | | 438/123 |
| 6,781,242 B1 | 8/2004 | Fan et al. | | 257/777 |
| 6,800,948 B1 | 10/2004 | Fan et al. | | 257/783 |
| 6,812,552 B2 | 11/2004 | Islam et al. | | 257/666 |
| 6,818,472 B1 | 11/2004 | Fan et al. | | 438/106 |
| 6,818,978 B1 | 11/2004 | Fan | | 257/686 |
| 6,818,980 B1 | 11/2004 | Pedron, Jr. | | 257/706 |
| 6,841,859 B1 | 1/2005 | Thamby et al. | | 257/676 |
| 6,876,066 B2 | 4/2005 | Fee et al. | | 257/676 |
| 6,897,428 B2 | 5/2005 | Minamio et al. | | 250/208.1 |
| 6,933,176 B1 | 8/2005 | Kirloskar et al. | | 438/122 |
| 6,933,594 B2 | 8/2005 | McLellan et al. | | 257/676 |
| 6,940,154 B2 | 9/2005 | Pedron et al. | | 257/666 |
| 6,946,324 B1 | 9/2005 | McLellan et al. | | 438/111 |
| 6,964,918 B1 | 11/2005 | Fan et al. | | 438/614 |
| 6,967,126 B2 | 11/2005 | Lee et al. | | 438/122 |
| 6,969,638 B2 * | 11/2005 | Estepa et al. | | 438/115 |
| 6,979,594 B1 | 12/2005 | Fan et al. | | 438/113 |
| 6,982,491 B1 | 1/2006 | Fan et al. | | 257/778 |
| 6,984,785 B1 | 1/2006 | Diao et al. | | 174/52.2 |
| 6,989,294 B1 | 1/2006 | McLellan et al. | | 438/111 |
| 6,995,460 B1 | 2/2006 | McLellan et al. | | 257/676 |
| 7,008,825 B1 | 3/2006 | Bancod et al. | | 438/123 |
| 7,009,286 B1 | 3/2006 | Kirloskar et al. | | 257/684 |
| 7,049,177 B1 | 5/2006 | Fan et al. | | 438/123 |
| 7,060,535 B1 | 6/2006 | Sirinorakul et al. | | 438/123 |
| 7,071,545 B1 | 7/2006 | Patel et al. | | 257/686 |
| 7,091,581 B1 | 8/2006 | McLellan et al. | | 257/673 |
| 7,101,210 B2 | 9/2006 | Lin et al. | | 439/331 |
| 7,102,210 B2 | 9/2006 | Ichikawa | | 257/666 |
| 7,205,178 B2 | 4/2007 | Shiu et al. | | 438/110 |
| 7,224,048 B1 | 5/2007 | McLellan et al. | | 257/678 |
| 7,247,526 B1 | 7/2007 | Fan et al. | | 438/123 |
| 7,274,088 B2 | 9/2007 | Wu et al. | | 257/673 |
| 7,314,820 B2 | 1/2008 | Lin et al. | | 438/617 |
| 7,315,080 B1 | 1/2008 | Fan et al. | | 257/717 |
| 7,320,937 B1 | 1/2008 | Pal et al. | | |
| 7,342,305 B1 | 3/2008 | Diao et al. | | 257/706 |
| 7,344,920 B1 | 3/2008 | Kirloskar et al. | | 438/123 |
| 7,348,663 B1 | 3/2008 | Kirloskar et al. | | 257/704 |
| 7,358,119 B2 | 4/2008 | McLellan et al. | | 438/127 |
| 7,371,610 B1 | 5/2008 | Fan et al. | | 438/112 |
| 7,372,151 B1 | 5/2008 | Fan et al. | | 257/738 |
| 7,381,588 B1 | 6/2008 | Patel et al. | | 438/109 |
| 7,399,658 B2 | 7/2008 | Shim et al. | | 438/106 |
| 7,408,251 B2 | 8/2008 | Hata et al. | | 257/678 |
| 7,411,289 B1 | 8/2008 | McLellan et al. | | 257/700 |
| 7,449,771 B1 | 11/2008 | Fan et al. | | 257/676 |
| 7,482,690 B1 | 1/2009 | Fan et al. | | 257/724 |
| 7,595,225 B1 | 9/2009 | Fan et al. | | 438/112 |
| 7,714,418 B2 | 5/2010 | Lim et al. | | 257/670 |
| 2003/0006055 A1 | 1/2003 | Chien-Hung et al. | | 174/52.1 |
| 2003/0045032 A1 | 3/2003 | Abe | | 438/123 |
| 2003/0071333 A1 | 4/2003 | Matsuzawa | | 257/676 |
| 2003/0143776 A1 | 7/2003 | Pedron, Jr. et al. | | 438/106 |
| 2003/0178719 A1 | 9/2003 | Combs et al. | | 257/704 |
| 2003/0201520 A1 | 10/2003 | Knapp et al. | | 257/666 |
| 2003/0207498 A1 | 11/2003 | Islam et al. | | 438/120 |
| 2004/0014257 A1 | 1/2004 | Kim et al. | | 438/111 |
| 2004/0046237 A1 | 3/2004 | Abe et al. | | 257/676 |
| 2004/0046241 A1 | 3/2004 | Combs et al. | | 257/678 |
| 2004/0080025 A1 | 4/2004 | Kasahara et al. | | 257/666 |
| 2004/0110319 A1 | 6/2004 | Fukutomi et al. | | 438/106 |
| 2004/0209443 A1 | 10/2004 | Cadieux | | |
| 2005/0003586 A1 | 1/2005 | Shimanuki et al. | | 438/124 |
| 2005/0037618 A1 | 2/2005 | Lee et al. | | |
| 2005/0077613 A1 | 4/2005 | McLellan et al. | | 257/706 |
| 2006/0192295 A1 | 8/2006 | Lee et al. | | 257/778 |
| 2006/0223229 A1 | 10/2006 | Kirloskar et al. | | 438/106 |
| 2006/0223237 A1 | 10/2006 | Combs et al. | | 438/122 |
| 2006/0273433 A1 | 12/2006 | Itou et al. | | 257/666 |
| 2007/0001278 A1 | 1/2007 | Jeon et al. | | 257/676 |
| 2007/0090497 A1 | 4/2007 | Abbott | | |
| 2007/0090529 A1 | 4/2007 | McCarthy et al. | | |
| 2007/0200210 A1 | 8/2007 | Zhao et al. | | 257/676 |
| 2007/0235217 A1 | 10/2007 | Workman | | 174/260 |
| 2008/0048308 A1 | 2/2008 | Lam | | 257/686 |
| 2008/0150094 A1 | 6/2008 | Anderson | | 257/659 |
| 2008/0246132 A1 * | 10/2008 | Kasuya et al. | | 257/676 |

OTHER PUBLICATIONS

Final Office Action dated Nov. 8, 2011, U.S. Appl. No. 12/579,600, filed Oct. 15, 2009, Woraya Benjavasukul et al.

Non-Final Office Action dated May 26, 2011, U.S. Appl. No. 12/579,600, filed Oct. 15, 2009, Woraya Benjavasukul et al.

Non-Final Office Action dated Feb. 15, 2012, U.S. Appl. No. 12/579,600, filed Oct. 15, 2009, Woraya Benjavasukul et al.

Office Action dated Jun. 22, 2012, U.S. Appl. No. 12/579,600, filed Oct. 15, 2009, Woraya Benjavasukul et al.

Office Action dated Jul. 9, 2012, U.S. Appl. No. 12/579,574, filed Oct. 15, 2009, Woraya Benjavasukul.

* cited by examiner

METALLIC SOLDERABILITY PRESERVATION COATING ON METAL PART OF SEMICONDUCTOR PACKAGE TO PREVENT OXIDE

RELATED APPLICATIONS

This application is a Divisional Application of co-pending U.S. patent application Ser. No. 12/579,574 filed Oct. 15, 2009 and titled "Metallic Solderability Preservation Coating on Metal Part of Semiconductor Package to Prevent Oxide," which in turn claims benefit of priority under 35 U.S.C. section 119(e) of the U.S. Provisional Patent Application Ser. No. 61/210,125 filed Mar. 12, 2009, entitled "Metallic Solderability Preservation (MSP) Coating on Metal Part of Semiconductor Package to Prevent Oxide," all of which are hereby incorporated by reference in its entirety.

FIELD OF THE INVENTION

The present invention is related to the field of semiconductor device manufacturing. More specifically, the present invention relates to metallic solderability preservation coating on metal part of semiconductor package to prevent oxide.

BACKGROUND

A semiconductor device array contains individual integrated circuits or semiconductor packages. Connectors 105 of the semiconductor packages are exposed at the top of the semiconductor array 100, as illustrated in FIG. 1A. The connectors 105 are typically made of copper. To prevent oxidation on the copper surface, the connectors 105 are plated with a lead finished material, such as matte tin (Sn), using electroplating. As a result, the top surfaces of the connectors 105' are thereafter tin plated, as illustrated in FIG. 1B.

Singulation is a process of separating each semiconductor package from a molded sheet. Dicing or sawing is a process that singulates the semiconductor array 100' into individual or singulated semiconductor packages. Conventionally, the electroplated semiconductor array 100' is diced into singulated semiconductor packages to be shipped to customers for assembly onto printed circuit boards. FIG. 1C illustrates a saw 115 dicing the semiconductor array 100'. The saw 115 typically follows a saw path 110 across the plated connectors 105', resulting in connectors on peripheral edges of the singulated semiconductor packages.

FIG. 2A illustrates a singulated semiconductor package 200 having a plurality of connectors 205 on the peripheral edges. Although tops of the connectors 205*a* are tin plated, sidewalls of the connectors 205*b* are exposed (e.g., without tin plating), because the dicing occurred after the semiconductor array 100 was electroplated with the lead finished material. If the singulated semiconductor package 200 is stored in inappropriate environments and/or conditions (e.g., moisture in the air, acids, bases, salts, oils, aggressive metal polished, and other solid and liquid chemicals) after singulation, then the exposed surfaces 205*b* become sites for potential corrosion 210 such as copper oxide, as illustrated in FIG. 2B. This aging process is known as oxidation. The exposed surfaces 205*b*, usually deposited with pollutant layers of oxide and other nonmetallic compound 210, often interfere with or inhibit solder wettability. The resulting oxide layer reduces solderability because contamination 210 prevents the metal from soldering well. The rate of oxidation can increase with an increase in temperature or humidity. Solder problems are a common cause for device failures.

A perfectly clean surface is required for assembly of singulated semiconductor packages 200 onto printed circuit boards. Since metal oxides form a barrier that prevents molten solder from forming a true metallurgical bond, the metal oxides must be removed prior to soldering or must be avoided in the first place.

The present invention addresses at least these limitations in the prior art.

SUMMARY OF THE DISCLOSURE

A first aspect of the present invention is for a method of preventing contaminants from forming on metal surfaces of semiconductor package connectors. The method includes performing a first cleaning of a semiconductor package using a cleaner agent, thereby reducing surface tension of unexpected material. Performing the first cleaning includes immersing the semiconductor package in the cleaner agent. In some embodiments, the semiconductor package is immersed in the cleaner agent for five minutes at 50° C. In some embodiments, the cleaner agent is acid. The method further includes performing a first DI water rinsing of the semiconductor package, thereby removing the undesired material and the cleaner agent. The method further includes performing a second cleaning of the semiconductor package. In some embodiments, the second cleaning is micro-etching, wherein the micro-etching creates a uniform topography on the surfaces of the metal connectors. In some embodiments, the second cleaning includes immersing the semiconductor package in a chemical bath. The chemical bath is hydrogen peroxide, sulphuric acid, sodium persulfate, or any suitable chemical bath. In some embodiments, the semiconductor package is immersed in the chemical bath for about 60 seconds at 40° C. The method further includes performing a second DI water rinsing of the semiconductor package, thereby ensuring exposed surfaces of metal connectors are clean and ready for treatment. The semiconductor package is predipped, thereby activating the surfaces. In some embodiments, the predipping includes removing oxides and wetting the clean surfaces for 30 seconds at 30° C. in a predip solution, wherein the wet surfaces promotes a homogeneous metallic surface finishing. The predip solution is preferably an organic aqueous dispersion that has an efficient anti-tarnishing effect. The method further includes treating the semiconductor package with an anti-tarnish solution. In some embodiments, the treating step includes spraying the semiconductor package with the anti-tarnish solution. Alternatively, the treating step includes dipping the semiconductor package with the anti-tarnish solution. The anti-tarnish solution is preferably a metallic solution. In some embodiments, the anti-tarnish solution is applied to the semiconductor package at 45-52° C. or at 63-68° C. The anti-tarnish solution is applied to the semiconductor package for four to twelve minutes. The method further includes performing a third DI water rinsing of the semiconductor package, thereby cleaning excess chemical and ionic contaminants, and postdipping the semiconductor package, thereby protecting a metallic coating. The metallic coating prevents oxidation. A postdip solution is one of acid or alkaline base. The method further includes preforming a fourth DI water rinsing of the semiconductor package, and drying the semiconductor package. In some embodiments, the method further includes soldering the semiconductor package to a printed circuit board.

A second aspect of the present invention is for a method of preventing contaminants from forming on metal surfaces of semiconductor package connector. The method includes treating a semiconductor package with an anti-tarnish solution. In some embodiments, the treating step includes spraying the semiconductor package with the anti-tarnish solution. Alternatively, the treating step includes dipping the semiconductor package with the anti-tarnish solution. The anti-tarnish solution is preferably a metallic solution. In some embodiments, the anti-tarnish solution is applied to the semiconductor package at 45-52° C. or at 63-68° C. The anti-tarnish solution is applied to the semiconductor package for four to twelve minutes. The method further includes performing a first DI water rinsing of the semiconductor package, thereby cleaning excess chemical and ionic contaminants, and drying the semiconductor package. In some embodiments, the method further includes soldering the semiconductor package to a printed circuit board.

A third aspect of the present invention is also for a method of preventing contaminants from forming on metal surfaces of semiconductor package connector. The method includes creating a mixture for use during singulation, and spraying a semiconductor array with the mixture during singulation, thereby treating a plurality of semiconductor packages. This creating step includes adding an anti-tarnish solution to a cutting fluid. The anti-tarnish solution is a metallic solution. In some embodiments, the anti-tarnish solution is applied to the plurality of semiconductor packages at 45-52° C. or at 63-68° C. The anti-tarnish solution is applied to the plurality of semiconductor packages for four to twelve minutes. The method further includes performing a first DI water rinsing of at least one semiconductor package, and drying the at least one semiconductor package. In some embodiments, the method further includes soldering the at least one semiconductor package to a printed circuit board.

A fourth aspect of the present invention is for a method of preserving metallic solderability of a semiconductor package. The method includes coating connectors with a metallic solution, wherein the coating occurs during or after sawing a semiconductor array, wherein the sawing creates a plurality of semiconductor packages, wherein the metallic solution is configured to prevent metal oxidation. The metallic solution is an anti-tarnish solution. The metallic solution is tin, silver, gold, nickel-gold, or any suitable metallic solution. In some embodiments, the coating is applied via dipping the semiconductor package in the metallic solution or by spraying the semiconductor package with the metallic solution when the coating occurs after sawing the semiconductor array. In some embodiments, the coating is applied via spraying when the coating occurs during sawing of the semiconductor array. In some embodiments, the coating occurs at 45-52° C. or at 63-68° C. The coating is applied for four to twelve minutes. In some embodiments, the method includes, before the coating, performing at least one cleaning and at least one rinsing of the semiconductor package when the semiconductor package is exposed to contaminants. In some embodiments, the method further includes soldering the semiconductor package to a printed circuit board.

A fifth aspect of the present invention is for a metallic solderability preservation method. A semiconductor array is loaded into a singulation machine. The semiconductor array includes a plurality of semiconductor packages. The semiconductor packages are treated with an anti-tarnish solution, thereby plating all exposed surfaces of semiconductor connectors. In some embodiments, the loading step includes mixing the anti-tarnish solution with a cutting fluid, such that the treating occurs when the mixture is sprayed on the semiconductor array during dicing. Alternatively, the semiconductor packages are sprayed with the anti-tarnish solution after singulation. Alternatively, the semiconductor packages are dipped into the anti-tarnish solution after singulation. In some embodiments, the anti-tarnish solution is a metallic solution. The metallic solution is one of tin, silver, gold, and nickel-gold. In some embodiments, the anti-metallic solution is applied at 45-52° C. or at 63-68° C. The anti-metallic solution is applied for four to twelve minutes. In some embodiments, the method further includes soldering the semiconductor package to a printed circuit board.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Figure 1A:
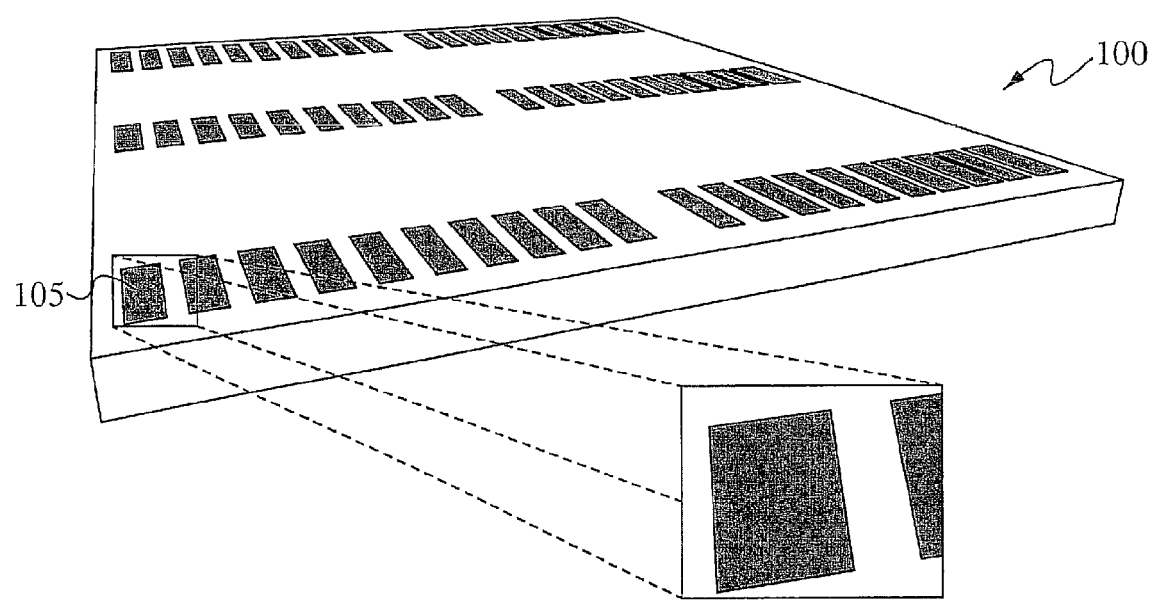
FIG. 1A illustrates an exemplary semiconductor array.
Figure 1B:
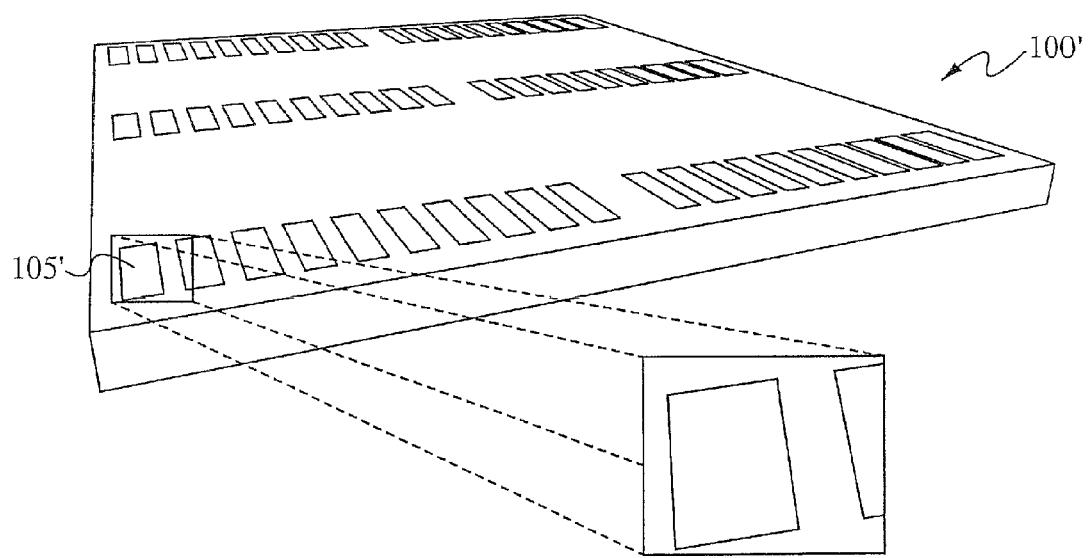
FIG. 1B illustrates the semiconductor array with connectors coated with tin.
Figure 1C:
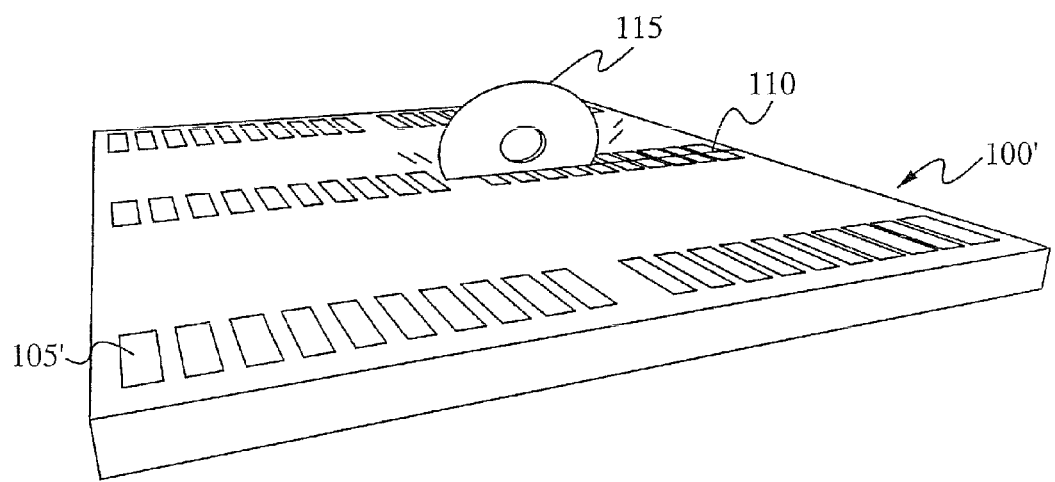
FIG. 1C illustrates the semiconductor array being diced with a saw.

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives.

Reference will now be made in detail to implementations of the present invention as illustrated in the accompanying drawings. The same reference indicators will be used throughout the drawings and the following detailed description to refer to the same or like parts.

Embodiments of the present invention are directed to a metallic solderability preservation (MSP) coating on metallic contacts of semiconductor package to prevent formulation of oxides. Singulated semiconductor packages can have unexpected material or contaminants, including fingerprints and oxides, on exposed metal areas of semiconductor connectors, including top surfaces and sidewalls. For example, oxidation typically occurs on exposed copper areas of these connectors when the semiconductor packages are not stored in appropriate environments. Copper oxides prevent the metal from soldering well.

An anti-tarnish solution of the present invention is used to coat the metal connectors during sawing, after sawing, or both of a semiconductor array to preserve metallic solderability. The anti-tarnish solution in some embodiments is a metallic solution, such as tin, silver, gold, nickel-gold, or any suitable solution. Coating the exposed copper areas with an anti-tarnish solution protects the exposed copper from oxidation. Such coating advantageously allows the semiconductor packages to not need be assembled (e.g., soldered to printed circuit boards) immediately after fabrication.

As discussed above, singulated semiconductor packages can be protected from oxidation during or after a sawing process of a semiconductor array, regardless whether the semiconductor array has been previously electroplated. If a singulated semiconductor package is assembled some time after the sawing process, then it is likely that the singulated semiconductor package has been exposed to contaminants, especially if the singulated semiconductor package had not been stored properly. As such, additional measures are taken to ensure that the connectors are free from debris before the preservation of metallic solderability. If the singulated semiconductor package is assembled immediately after the sawing process, then additional measures need not be taken since the singulated semiconductor package has not been exposed to contaminants. Each of the scenarios of metallic solderability preservation is explored in detail below.

Scenario 1: Preservation after Sawing and Exposure to Contaminants

In some embodiments, an anti-tarnish solution is coated on exposed metal areas of connectors after a singulated semiconductor package has been exposed to contaminants, such as oxides. As discussed above, oxidation occurs when the semiconductor package is not stored in an appropriate environment after fabrication. Exposed metal areas of the connectors include at least sidewalls of the connectors. Top surfaces of the connectors are also exposed if the semiconductor array had not been previously electroplated.

Figure 3:
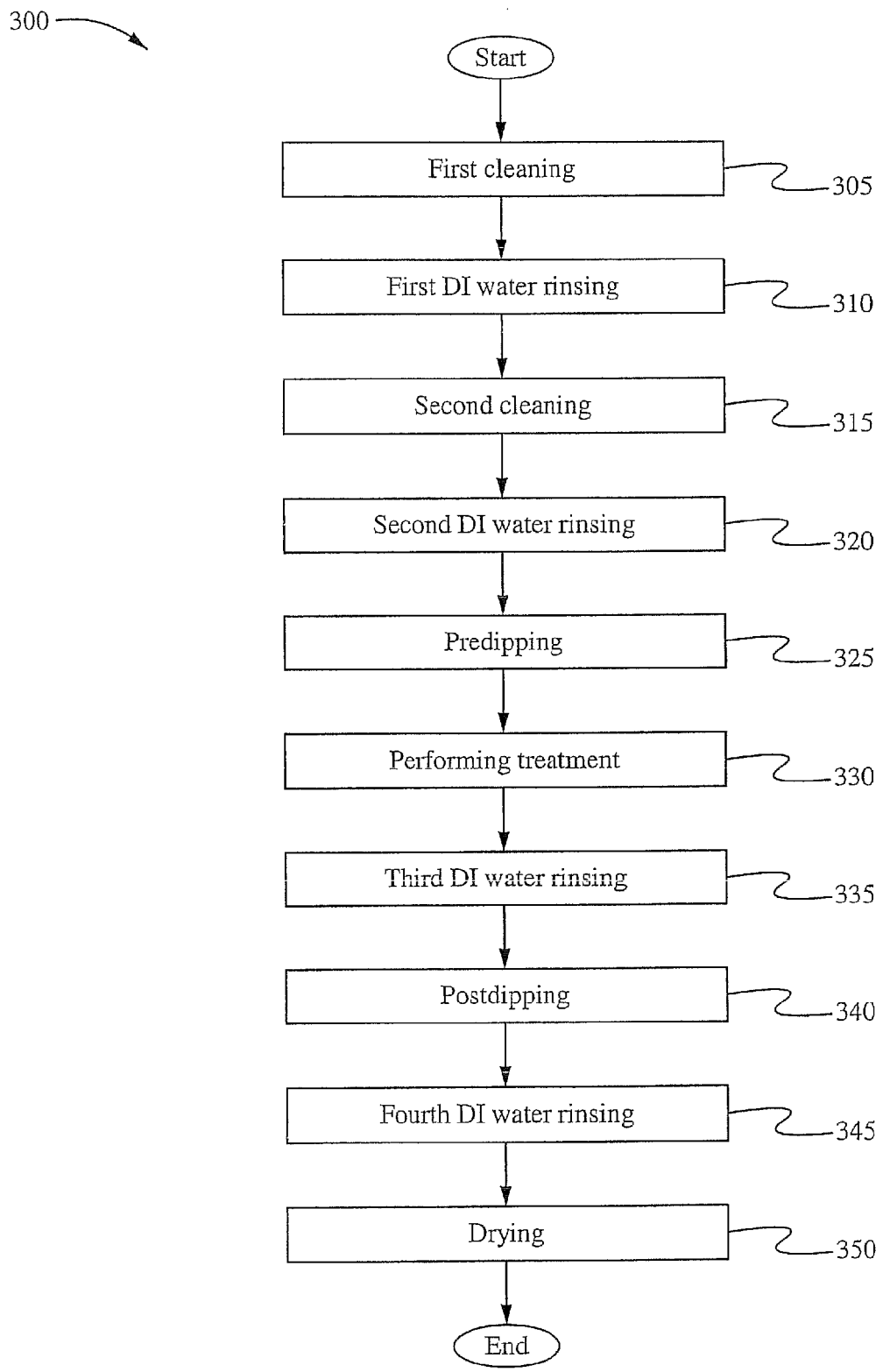
FIG. 3 illustrates an exemplary method of protecting a singulated semiconductor package in one embodiment of the present invention.

Assuming that the semiconductor package has been singulated from a semiconductor array and has not yet been assembled (e.g., soldered to a printed circuit board), FIG. 3 illustrates an exemplary method 300 of protecting a singulated semiconductor package in one embodiment of the present invention. The process starts at Step 305 with a first cleaning of the semiconductor package using a cleaner agent. The cleaner agent helps reduce surface tension of unexpected material on the semiconductor package. In some embodiments, the semiconductor package is immersed in the cleaner agent for five minutes at a temperature of 50° C. In some embodiments, the cleaner agent is acid, which acts as a detergency and emulsification to effectively remove contaminants, such as oxides and fingerprints.

At a Step 310, a first deionized (DI) water rinse is performed. The DI water is used to rinse the semiconductor package to remove contaminants and the cleaner agent.

At a Step 315, a second cleaning step is performed. In some embodiments, the second cleaning step is micro-etching. Preferably, micro-etching creates a uniform topography on the surfaces of the metal connectors. Various chemical baths can be used for micro-etching the connectors, such as hydrogen peroxide, sulphuric acid, sodium persulfate, or any suitable chemical. In some embodiments, the semiconductor package is immersed in the chemical bath for about 60 seconds at a temperature of 40° C.

At a Step 320, a second DI water rinse is performed. The second DI water rinse ensures that exposed surfaces of the metal connectors are clean and are ready for treatment and protection.

However, before treatment and protection, at a Step 325, a predip is performed to activate the surfaces of the metal connectors. In some embodiments, the process time of removing the remaining oxides and/or contaminants and wetting the surfaces is performed for 30 seconds at a temperature of 30° C. The "wet" surfaces promote a homogeneous metallic surface finishing. In some embodiments, the predip solution is an organic aqueous dispersion that has an efficient anti-tarnishing effect.

At a Step 330, a metallic coating is applied using an anti-tarnish solution. The anti-tarnish solution in some embodiments is a metallic solution, such as tin, silver, gold, nickel-gold, or any suitable solution. Depending on the desired thickness of the metallic film, the metallic coating can be applied in either a high or low temperature for four to twelve minutes via a dipping method or a spraying method. In some embodiments, at a relatively low temperature of 45-52° C., the metallic film thickness is about 0.35 micron. In some embodiments, at a relatively high temperature of 63-68° C., the metallic film thickness is about 1 micron.

Figure 6A:
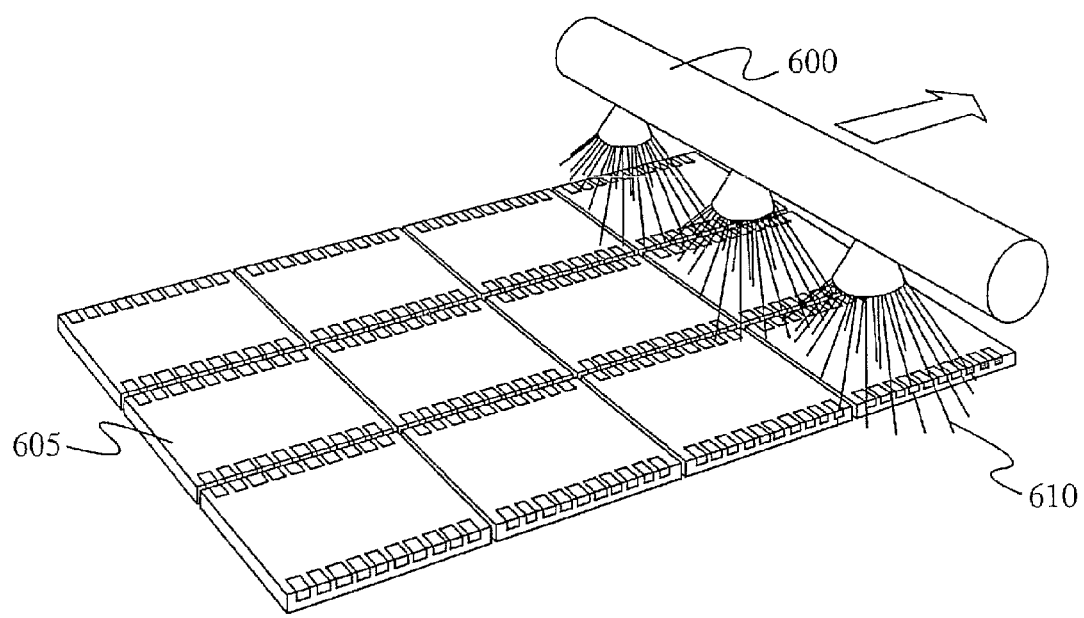
FIG. 6A illustrates metallic coating to singulated semiconductor packages via a spraying technique in some embodiments of the present invention.
Figure 6B:
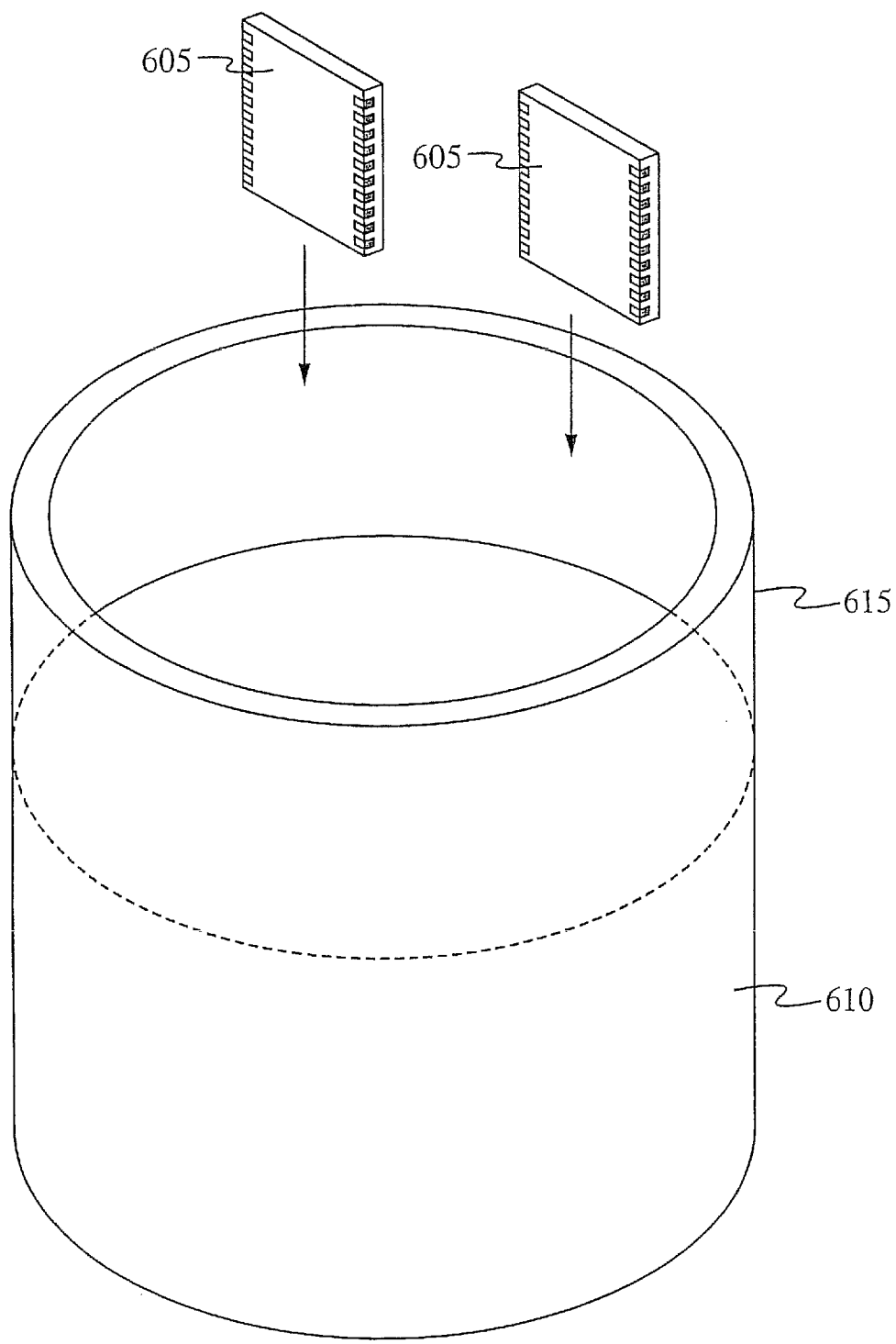
FIG. 6B illustrates metallic coating to singulated semiconductor packages via a dipping technique in some embodiments of the present invention.

The metallic coating can be applied to singulated semiconductor packages 605 via spraying the singulated semiconductor packages 605 using the anti-tarnish solution 610, as illustrated in FIG. 6A, or via dipping the singulated semiconductor packages 605 in the anti-tarnish solution 610, as illustrated in FIG. 6B. The MSP spraying and the MSP dipping, as illustrated, are electrodeless plating techniques. Other electrodeless plating techniques to apply the metallic coating on the semiconductor package are contemplated.

Figure 4:
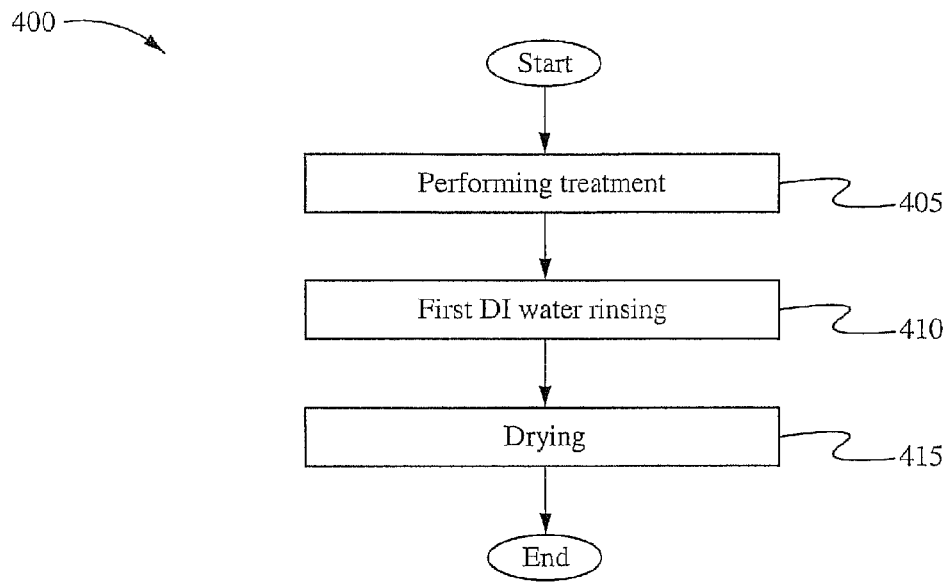
FIG. 4 illustrates another exemplary method of protecting a singulated semiconductor package in one embodiment of the present invention.
Figure 5:
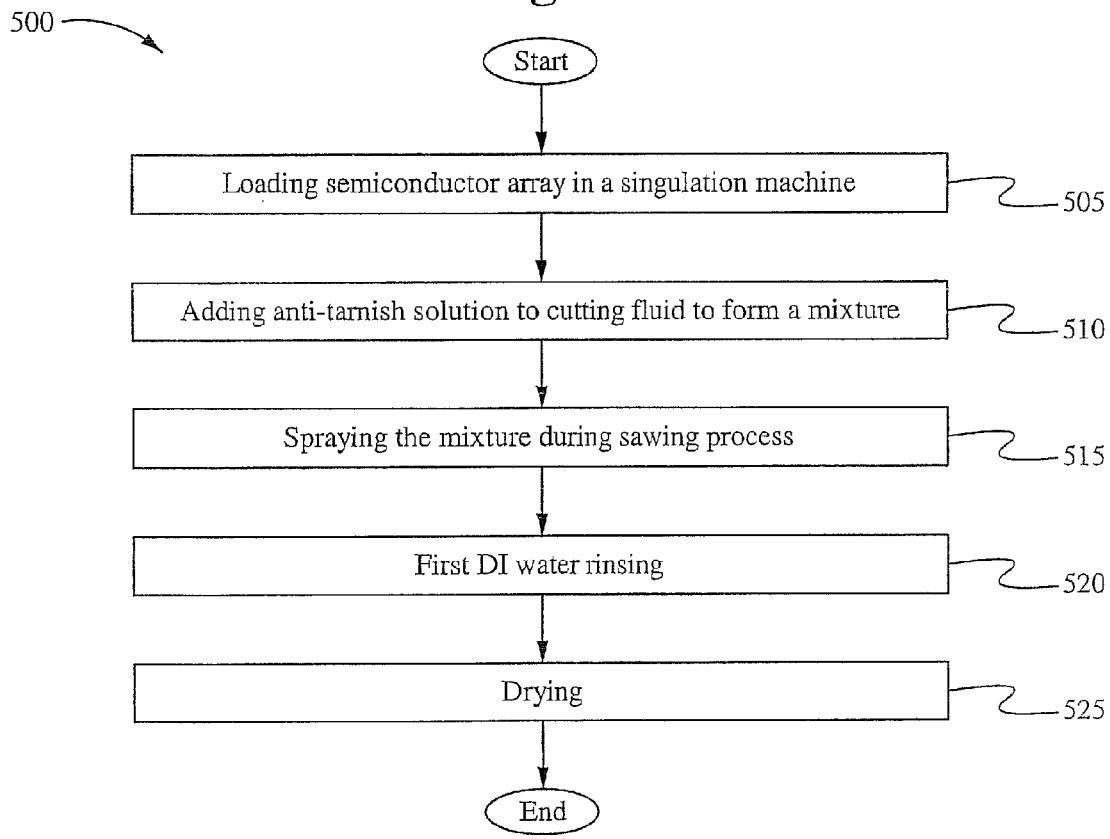
FIG. 5 illustrates yet another exemplary method of protecting a singulated semiconductor package in one embodiment of the present invention.

Although the singulated semiconductor packages 605 are shown in FIGS. 6A-6B as having been through electroplating (e.g., top surfaces of connectors are plated), the methods of protecting a singulated semiconductor package described in FIGS. 3-5 also apply to semiconductor arrays that have not been electroplated (e.g., top surfaces of connectors are not plated), in which both top surfaces and sidewalls are coated at the same time via the MSP process. In some embodiments, metallic coating on the top surfaces of connectors by electroplating has a thickness of about 10 microns, while metallic coating on sidewalls of connectors by MSP has a thickness of 1 micron.

Metal whiskering is the spontaneous growth of filiform hairs from a metallic surface. Whiskers cause short circuits and arcing in electrical circuits. If the semiconductor array had been previously electroplated with tin, then tin whiskering may occur. If metallic ion is tin deposit, then tin whiskering is a concerned element. Tin whiskers act like miniature antennas, affecting circuit impedance. Tin whiskers can reduce the conductivity of tin plating. Using a silver (Ag) derivative as an additive in a tin bath helps prevent whisker growth by creating an Ag film on the clean exposed surfaces. The Ag film advantageously decreases both stress formation and velocity of intermetallic layer build up. By the way, whisker growth is not issue for silver, gold, nickle-gold coating.

It should be understood that embodiments of the present invention can be applied to semiconductor packages that have been previously coated with, for example, tin. In such a case, the metallic solution of the present invention would also be used as a "filler." Since the metallic solution can be used as a filler, costs can be minimized because a thinner film of the metallic solution can be applied rather than a thicker film on the surfaces.

In some embodiments, a separate rinse is not required between the Step 330 and the Step 325 because the predip solution does not contain additives. In some embodiments, the predip solution and the metallic coating use the same components. In other embodiments, a separate rinse is able to be performed between the Step 330 and the Step 325.

At a Step 335, a third DI water rinse is performed. The third DI water rinse cleans excess chemicals and any ionic contaminants before the metallic coating is protected with a postdip solution. In some embodiments, the DI water used at the Step 335 is hot.

At a Step 340, a postdip is performed to prevent oxidation reaction on the metal coating by using an acid or alkaline base. The postdip is performed for treatments of both spraying and dipping.

At a Step 345, a fourth DI water rinse is performed. In some embodiments, the DI water used at the Step 345 is hot. In other embodiments, the DI water used at the Step 345 is at room temperature.

At a Step 350, the semiconductor package is placed in a dryer. In some embodiments, the dryer is an oven. The process 300 terminates after the Step 350. At any time after preserving the metallic solderability, the semiconductor package can be soldered to a printed circuit board since the connectors have been protected or preserved, which advantageously prevents metal oxidation.

Scenario 2: Preservation Immediately after Sawing but Before Exposure to Contaminants In some embodiments, an anti-tarnish solution is coated on exposed metal areas of connectors of a singulated semiconductor package immediately after sawing a semiconductor array but before the singulated semiconductor package has been exposed to contaminants. Since the semiconductor package has not been exposed to contaminants during fabrication, cleaning the semiconductor package prior to treatment is therefore not necessary. Such cleaning is to remove possible contaminants.

Assuming that the semiconductor package has been singulated from a semiconductor array and has not yet been assembled (e.g. soldered to a printed circuit board), FIG. 4 illustrates another exemplary method 400 of protecting the singulated semiconductor package in one embodiment of the present invention. The process starts at a Step 405 by applying a metallic coating to the recently singulated semiconductor package using an anti-tarnish solution. Since the Step 405 is similar to the Step 330 discussed above, the Step 405 is not detailed here.

At a Step 410, a first DI water rinse is performed. The first DI water rinse cleans excess chemicals and any ionic contaminants. The Step 410 is similar to the Step 335.

In some embodiments, a post dip and a second DI water rinse are performed after the first DI water rinse. Although these steps are not illustrated, they are similar to the Steps 340 and 345 described above.

At a Step 415, the semiconductor package is placed in a dryer. In some embodiments, the dryer is an oven. The process 400 terminates after the Step 415. At any time after preserving the metallic solderability, the semiconductor package can be soldered to a printed circuit board since the connectors have been protected or preserved, which advantageously prevents metal oxidation.

Scenario 3: Preservation During Sawing

In some embodiments, singulated semiconductor packages can be protected from oxidation during a sawing process. Since the semiconductor packages would not have been exposed to contaminants during fabrication, cleaning the semiconductor packages prior to treatment is therefore not necessary. Such cleaning is to remove possible contaminants.

Assuming that the semiconductor packages have not yet been singulated from a semiconductor array, FIG. 5 illustrates yet another exemplary method 500 of protecting singulated semiconductor packages in one embodiment of the present invention. The process starts at a Step 505 by loading the semiconductor array that needs to be diced in a singulation saw machine.

At a Step 510, an anti-tarnish solution, such as the ones discussed above, is applied to a cutting fluid to form a mixture. The cutting fluid is typically used to cool the blade of the singulation saw machine during sawing. In some embodiments, the Step 505 and the Step 510 are interchangeable or can be performed simultaneously.

At a Step 515, the mixture is sprayed during the sawing process of the semiconductor array. The sawing process dices the semiconductor array into a plurality of singulated semiconductor packages. Each singulated semiconductor package is thereby treated with the anti-tarnish solution. In other words, each singulated semiconductor package is coated with a layer of metal, such as tin, silver, gold, nickel-gold, or any suitable solution.

At a Step 520, a first DI water rinse is performed. The first DI water rinse cleans excess chemicals and any ionic contaminants. In some embodiments, the DI water used at the Step 520 is hot. After preserving the metallic solderability, the semiconductor packages can be soldered to printed circuit boards.

In some embodiments, a post dip and a second DI water rinse are performed after the first DI water rinse. Although these steps are not illustrated, they are similar to the Steps 340 and 345 described above.

At a Step 525, the singulated semiconductor packages are placed in a dryer. In some embodiments, the dryer is an oven. The process 500 terminates after the Step 525. At any time after preserving the metallic solderability, the semiconductor package can be soldered to a printed circuit board since the connectors have been protected or preserved, which advantageously prevents metal oxidation.

It should be understood that MSP can be applied in other scenarios to prevent contaminations, such oxides, on metal parts by coating the metal parts with an anti-tarnish solution.

Singulated Semiconductor Packages with MSP Coating

Embodiments of the present invention advantageously improves the quality of package soldering to printed circuit boards since contaminants are removed prior to soldering. Further, each of the above described methods advantageously prevents oxidation on the metal conductors of a semiconductor packages.

Figure 2A:
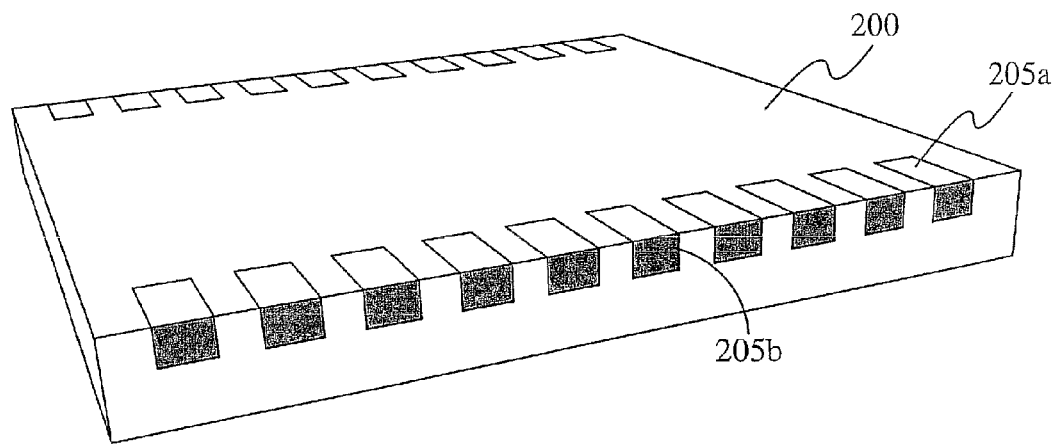
FIG. 2A illustrates a singulated semiconductor package having a plurality of connectors on peripheral edges.
Figure 2B:
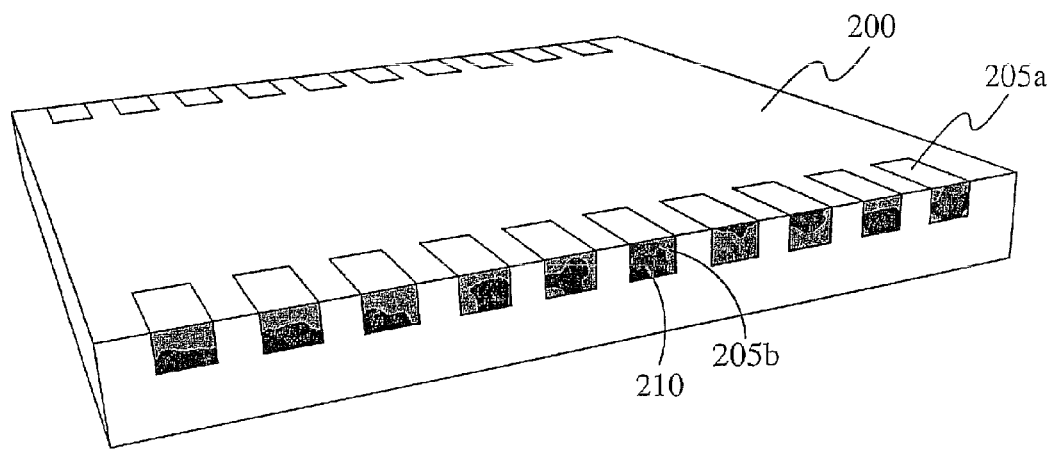
FIG. 2B illustrates the plurality of connectors with contaminants.
Figure 7:
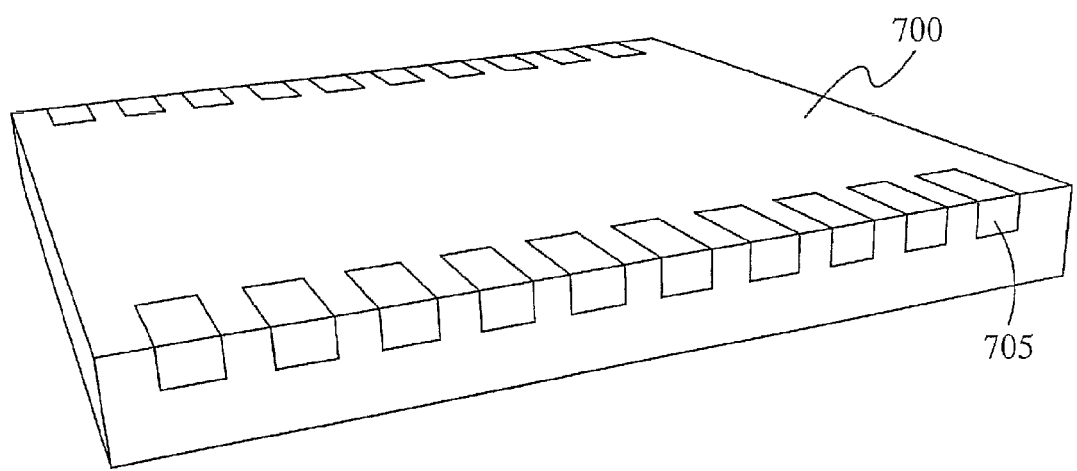
FIG. 7 illustrates a treated singulated semiconductor package in some embodiments of the present invention.

FIG. 7 illustrates a treated singulated semiconductor package 700 in some embodiments of the present invention. It is possible to distinguish between a semiconductor package with and a semiconductor package without MSP. Particularly, a semiconductor package without MSP has connectors that are copperish in color, specifically at least the sidewalls of the connectors, as illustrated in FIG. 2A. In contrast, a semiconductor package with MSP has connectors that are entirely metallically coated. As illustrated in FIG. 7, top surfaces and sidewalls of the connectors 705 have the same metallic color. However, the colors will be different if two types of metal are used, for example, tin for the top surfaces and gold for the side walls.

The metallic coating in some embodiments is a dense metal grain deposit with large and polygonized crystal structures that preserve metallic solderability. The metallic coating can be of tin, silver, gold, nickel-gold, or any suitable metallic coating. Metallic solderability preservation protects the connectors of the semiconductor package from moisture, thereby preventing metal oxidation. Metallic solderability preservation allows a full semiconductor array to be diced prior to shipping.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of preventing contaminants from forming on metal surfaces of connectors of a semiconductor package, wherein each connector includes a first surface exposed at and flushed with a first package surface before singulation, the method comprising:
   a. exposing a second surface of each connector after singulation such that the second surface is flushed with a second package surface;
   b. upon singulation, treating the first surface and the second surface with an anti-tarnish solution;
   c. performing a first DI water rinsing of the semiconductor package, thereby cleaning excess chemical and ionic contaminants; and
   d. drying the semiconductor package.

2. The method of claim 1, wherein the treating includes spraying the semiconductor package with the anti-tarnish solution.

3. The method of claim 1, wherein the treating includes dipping the semiconductor package with the anti-tarnish solution.

4. The method of claim 1, wherein the anti-tarnish solution is a metallic solution.

5. The method of claim 1, wherein the anti-tarnish solution is applied to the semiconductor package at 45-52° C. or at 63-68° C.

6. The method of claim 1, wherein the anti-tarnish solution is applied to the semiconductor package for four to twelve minutes.

7. The method of claim 1, further comprising coupling the semiconductor package to a PCB.

8. The method of claim 1, wherein the first DI water is hot.

9. The method of claim 1, further comprising, after cleaning and before drying:
   a. preventing oxidation reaction on the first surface and the second surface treated with the anti-tarnish solution; and
   b. rinsing the semiconductor package with a second DI water.

10. The method of claim 1, wherein the first surface and the second surface are not cleaned prior to treatment.

11. The method of claim 1, wherein the first surface and the second surface are treated once.

* * * * *